(12) United States Patent
Bhushan et al.

(10) Patent No.: US 12,278,202 B2
(45) Date of Patent: Apr. 15, 2025

(54) MODULAR CONSTRUCTION OF HYBRID-BONDED SEMICONDUCTOR DIE ASSEMBLIES AND RELATED SYSTEMS AND METHODS

(71) Applicant: Micron Technology, Inc., Boise, ID (US)

(72) Inventors: Bharat Bhushan, Taichung (TW); Akshay N. Singh, Boise, ID (US); Bret K. Street, Meridian, ID (US); Debjit Datta, Taichung (TW); Eiichi Nakano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 393 days.

(21) Appl. No.: 17/830,224

(22) Filed: Jun. 1, 2022

(65) Prior Publication Data

US 2023/0395545 A1    Dec. 7, 2023

(51) Int. Cl.
*H01L 25/065* (2023.01)
*H01L 23/00* (2006.01)

(52) U.S. Cl.
CPC ............. *H01L 24/08* (2013.01); *H01L 24/80* (2013.01); *H01L 24/95* (2013.01); *H01L 25/0652* (2013.01); *H01L 2224/08148* (2013.01); *H01L 2224/8001* (2013.01); *H01L 2224/80047* (2013.01); *H01L 2224/80204* (2013.01); *H01L 2224/80895* (2013.01); *H01L 2224/80896* (2013.01); *H01L 2224/95093* (2013.01); *H01L 2924/1011* (2013.01); *H01L 2924/182* (2013.01); *H01L 2924/3512* (2013.01); *H01L 2924/37001* (2013.01)

(58) Field of Classification Search
CPC ..... H01L 24/08; H01L 24/80; H01L 25/0652; H01L 2224/08148; H01L 2224/8001; H01L 24/95; H01L 21/56; H01L 25/18; H01L 23/3135; H01L 25/50
See application file for complete search history.

(56) References Cited

U.S. PATENT DOCUMENTS

| | | | | |
|---|---|---|---|---|
| 2007/0262436 A1* | 11/2007 | Kweon | ............... | H01L 23/3128 257/784 |
| 2013/0119528 A1* | 5/2013 | Groothuis | ........... | H01L 23/3675 257/777 |
| 2015/0170991 A1* | 6/2015 | Li | ....................... | H01L 23/4334 438/109 |

* cited by examiner

*Primary Examiner* — Thanh Y. Tran
(74) *Attorney, Agent, or Firm* — Perkins Coie LLP

(57) ABSTRACT

Stacked semiconductor assemblies, and related systems and methods, are disclosed herein. A representative stacked semiconductor assembly can include a lowermost die and two or more modules carried by an upper surface of the lowermost die. Each of the module(s) can include a base die and one or more upper dies and/or an uppermost die carried by the base die. Each of the dies in the module is coupled via hybrid bonds between adjacent dies. Further, the base die in a lowermost module is coupled to the lowermost die by hybrid bonds. As a result of the modular construction, the lowermost die can have a first longitudinal footprint, the base die in each of the module(s) can have a second longitudinal footprint smaller than the first longitudinal footprint, and each of the upper die(s) and/or the uppermost die can have a third longitudinal footprint smaller than the second longitudinal footprint.

20 Claims, 14 Drawing Sheets

MODULAR CONSTRUCTION OF HYBRID-BONDED SEMICONDUCTOR DIE ASSEMBLIES AND RELATED SYSTEMS AND METHODS

TECHNICAL FIELD

The present technology is generally related to methods for constructing semiconductor die assemblies and related systems and products. In particular, the present technology relates to the modular construction of semiconductor devices with hybrid bonded die stacks.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. To meet production demands, individual semiconductor dies are typically manufactured in bulk on a semiconductor wafer and then separated into individual semiconductor dies. The bulk manufacturing process can increase throughput and reduce difficulties in handling individual semiconductor dies as they continue to shrink in size. Individual semiconductor dies can then be stacked to form semiconductor assemblies.

Hybrid bonding, sometimes called fusion bonding or direct bonding, describes a bonding process with minimal (or no) intermediate layers between semiconductor dies. Instead, hybrid bonding processes rely on chemical bonds and interactions between interfacing surfaces. For example, a hybrid bonding process is based on intermolecular interactions including van der Waals forces, hydrogen bonds, and strong covalent bonds to join metal-metal interfaces as well as dielectric-dielectric surfaces at high temperatures and/or pressures. The direct bonds help semiconductor die manufacturers meet demands for a reduction in the volume occupied by semiconductor die assemblies.

Figure 1A:
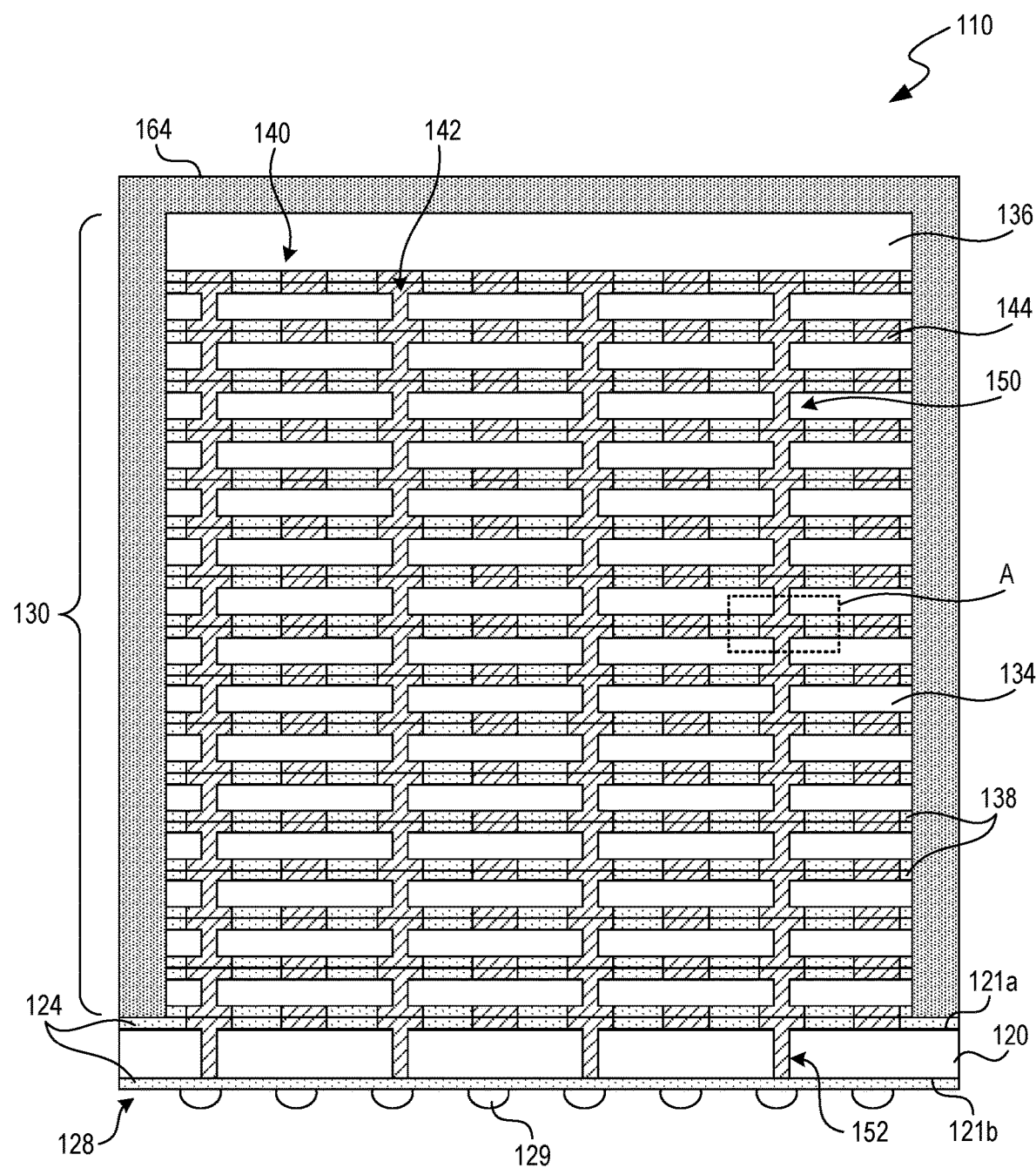
FIG. 1A is a cross-sectional view of a stacked semiconductor assembly in accordance with some embodiments of the present technology.

The drawings have not necessarily been drawn to scale. Further, it will be understood that several of the drawings have been drawn partially schematically. Similarly, some components and/or operations can be separated into different blocks or combined into a single block for the purpose of discussing some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

Overview

Stacked semiconductor assemblies, and related systems and methods, are disclosed herein. A representative semiconductor assembly can include a lowermost die and one or more modules carried by an upper surface of the lowermost die. Each of the module(s) can include a base die and one or more upper dies and/or an uppermost die carried by the base die. Each of the dies in the module is coupled via hybrid bonds between adjacent dies. More specifically, each of the adjacent dies can have a dielectric-dielectric bonded interface and one or more metal-metal bonds between bond pads on the adjacent dies. Further, one or more of the bond pads in the metal-metal bonds can be coupled to conductive through substrate vias (TSVs) and/or one or more of the bond pads can act as a thermal sink for adjacent dies. Accordingly, the hybrid bonds can establish mechanical (physical), electrical, and/or thermal coupling between adjacent dies. For example, the dielectric-dielectric bonds can physically hold adjacent dies together, metal-metal bonds between bond pads connected to traces, vias, and/or TSVs can establish electrical signal routes between the dies (and therefore through the module), and metal-metal bonds between thermal bond pads can help communicate heat between adjacent dies (and therefore through the module). Further, each of the modules can be mechanically, electrically, and/or thermally coupled by hybrid bonds therebetween. For example, an upper surface of an upper die in a first module can include dielectric-dielectric bonds and metal-metal bonds with the base die of a second module stacked on the first module. Still further, the base die in a lowermost module can be coupled to the lowermost die by hybrid bonds, thereby mechanically, electrically, and/or thermally coupling the lowermost module to the lowermost die. Still further, each of the module(s) can be coupled to an adjacent module by hybrid bonds, thereby mechanically, electrically, and/or thermally coupling each of the modules.

As discussed in more detail below, the modular construction of the stacked semiconductor assemblies can result in the lowermost die having a first longitudinal footprint, the base dies in each of the module(s) having a second longitudinal footprint smaller than the first longitudinal footprint, and each of the upper die(s) and/or the uppermost die having a third longitudinal footprint smaller than the second longitudinal footprint. Further, in some embodiments, each of the module(s) includes a first encapsulant contained within the second longitudinal footprint while the stacked semiconductor assembly overall includes a second encapsulant contained within the first longitudinal footprint. The first encapsulant can protect and/or insulate the sidewalls of the upper dies in each of the modules (e.g., protecting the upper dies from physical impact during manufacturing) while the second encapsulant can protect and/or insulate the sidewalls of each of the module(s) (e.g., protecting the module(s) from physical impact after manufacturing).

In various embodiments, the stacked semiconductor assembly can include one module, two modules, three modules, four modules, five modules, ten modules, or any other suitable number of modules. Further, each of the module(s) can include two dies (e.g., a base die and one upper die), three dies, (e.g., a base die, an upper die, and an uppermost die), four dies, five dies, ten dies, and/or any other suitable number of dies. In some embodiments, the stacked semiconductor assembly also includes one or more single dies stacked with the modules. Purely by way of example, the stacked semiconductor assembly can include the lowermost die, two modules stacked onto the lowermost die, and an uppermost die stacked onto the two modules.

In some embodiments, the uppermost die (sometimes also referred to herein as a "top die") in the stacked semiconductor assembly (whether included in a module or stacked alone) can have a thickness that can be varied and/or selected to match an overall height of the stacked semiconductor assembly to a predetermined height. The varying thickness can, for example, allow multiple stacked semiconductor assemblies within varying contents (e.g., different numbers of modules and/or dies therein) to have a generally uniform (or uniform) height.

DESCRIPTION OF THE FIGURES

For ease of reference, the stacked semiconductor assemblies, and associated systems and methods, are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the three-dimensional trace length matching features, and the associated semiconductor components and devices, can be moved to, and used in, different spatial orientations without changing the structure and/or function of the disclosed embodiments of the present technology.

FIG. 1A is a cross-sectional view of a stacked semiconductor assembly 110 in accordance with some embodiments of the present technology. In the illustrated embodiment, the stacked semiconductor assembly 110 includes a lowermost die 120 (sometimes also referred to herein as a "lowermost semiconductor die") that has an upper surface 121a and a lower surface 121b opposite the upper surface 121a. Each of the upper surface 121a and the lower surface 121b includes a dielectric layer 124 that can protect the lowermost die 120 and/or be directly bonded to another dielectric material. The stacked semiconductor assembly 110 also includes a stack of semiconductor dies 130 (sometimes also referred to herein as a "die stack 130") carried by the upper surface 121a. The die stack 130 can include one or more upper dies 134 (fifteen shown, sometimes also referred to herein as "upper semiconductor dies") and a top die 136 (sometimes also referred to herein as an "uppermost die" and/or "top semiconductor die"). Similar to the lowermost die 120, each of the upper dies 134 includes a dielectric layer 138 on the upper and lower surfaces of the upper dies 134. Similarly, the top die 136 includes the dielectric layer 138 on a lower surface of the top die 136.

As further illustrated in FIG. 1A, each of the lowermost die 120, the upper dies 134, and the top die 136 is electrically and thermally coupled through bond pads at interfacing surfaces in the stacked semiconductor assembly 110. For example, the lowermost die 120 and a lower-upper die 134a each include one or more electric bond pads 142 (four shown) and one or more thermal bond pads 144 (four shown) that are coupled at an interface I. In particular, each of the corresponding bond pads is coupled through a metal-metal bond, while the dielectric layers 124, 138 at the interface I are at least partially bonded together. Said another way, the lowermost die 120 and the lower-upper die 134a are coupled through hybrid bonding at the interface I. Similarly, each of the upper dies 134 and the top die 136 includes one or more electric bond pads 142 and one or more thermal bond pads 144 at the interfaces therebetween that are coupled via metal-metal bonds, while the dielectric layers 138 are all at least partially bonded at each of the interfaces in the die stack 130. Said another way, each of the upper dies 134 and the top die 136 can be coupled through hybrid bonding between interfacing surfaces.

Each of the electric bond pads 142 is electrically coupled to one or more conductive features in each of the dies in the die stack 130. For example, as illustrated, the electric bond pads 142 in the die stack 130 can be coupled to a through substrate via 150 ("TSV"), thereby establishing one or more communication channels through the die stack 130. Additionally, or alternatively, the electric bond pads 142 in the die stack 130 can be coupled to one or more active features (not shown) in each of the dies, for example through a redistribution layer (also not shown). Similarly, the electric bond pads 142 in the lowermost die 120 can be coupled to a TSV 152 coupling the upper surface 121a to a redistribution layer 128 at the lower surface 121b. The redistribution layer 128 can then couple each through substrate via 152 to a package interconnect 129 at the lower surface 121b, thereby enabling the stacked semiconductor assembly 110 to be coupled to an external source (e.g., another package, an interposer substrate, a printed circuit board, and the like).

Each of the thermal bond pads 144 can help communicate heat (e.g., from the active components in each of the dies) through the stacked semiconductor assembly 110. Additionally, or alternatively, each of the thermal bond pads 144 can provide additional structural support to the stacked semiconductor assembly 110. For example, each of the thermal bond pads 144 can provide another bonded structure between the dies in the die stack 130 and/or between the die stack 130 and the lowermost die 120. Accordingly, for example, the thermal bond pads 144 can anchor the dies even when some of the other hybrid bonds (e.g., metal-metal bonds between the electric bond pads 142 and/or bonds between dielectric layers) fail.

As further illustrated in FIG. 1A, the stacked semiconductor assembly 110 can include an encapsulant 164 covering the sidewalls and/or an uppermost surface of the die stack 130. The encapsulant 164 can be any suitable molding material to insulate and/or protect the die stack 130 from damage during and/or after manufacturing.

Figure 1B:
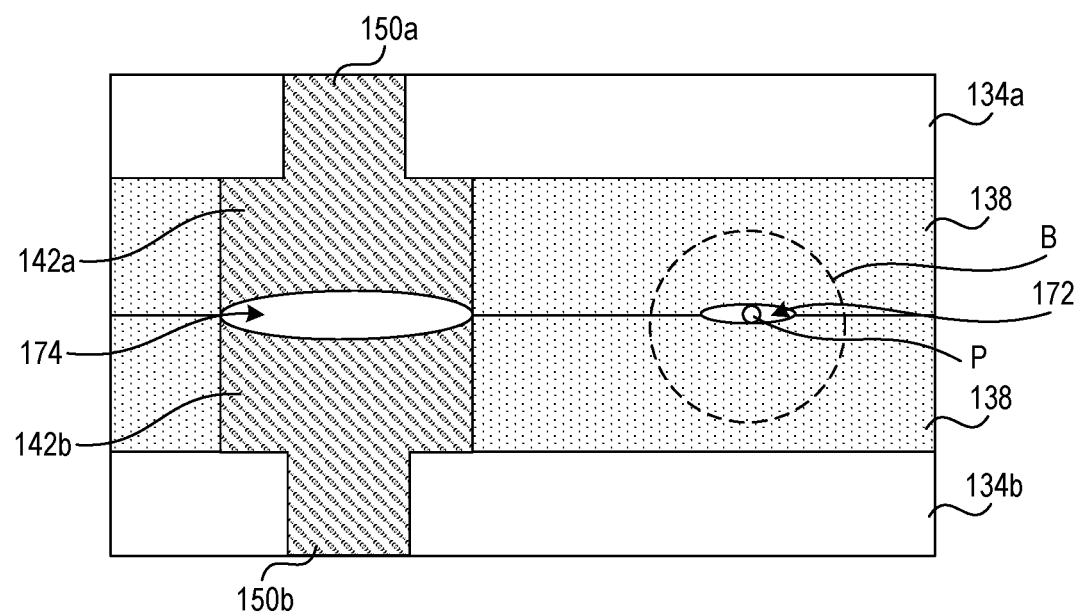
FIG. 1B is a cross-sectional view of a region of the stacked semiconductor assembly of FIG. 1A in accordance with some embodiments of the present technology.

FIG. 1B is a cross-sectional view of a region A the stacked semiconductor assembly of FIG. 1A illustrating some shortcomings in the stacked semiconductor assembly in accordance with some embodiments of the present technology. As illustrated in FIG. 1B, the region A includes a portion of a first upper die 134b having a first TSV 150b electrically coupled to a first electric bond pad 142b. The first upper die 134b is carried by a second upper die 134c that similarly includes a second TSV 150c electrically coupled to a second electric bond pad 142c. As discussed above, the first and second electric bond pads 142b, 142c can be coupled via a metal-metal bond. However, the quality of the metal-metal bond is dependent partly on the temperature and pressure at the first and second electric bond pads 142b, 142c during the bonding process. Because the die stack 130 (FIG. 1A) is relatively large, the bonding process can result in a temperature and/or pressure gradient across the die stack 130 where some regions (e.g., the region A) have an insufficient temperature and/or pressure. As a result of the insufficient conditions, a void 174 can form between the first and second electric bond pads 142b, 142c, thereby undermining the quality of the metal-metal bond.

As further illustrated in FIG. 1B, a particle P is positioned between the dielectric layers 138 on the first and second upper dies 134b, 134c. The particle P has caused a void 172 to form during the bonding process, thereby undermining the quality of the dielectric-dielectric bond in the region B. In some embodiments, a manufacturing process for the stacked semiconductor assembly 110 (FIG. 1A) can include one or more cleaning processes to remove particles and/or other impurities from the surfaces of dies before they are stacked and thereby reduce the number of voids formed between the dielectric layers 138. However, as the die stack 130 (FIG. 1A) increases in size, the cleaning processes become farther removed from the stacking process for the uppermost dies in the die stack 130, thereby providing a window for new particles to be caught on the surfaces of the dies.

As a result of each of the voids 172, 174, the quality of the hybrid bond between the first and second upper dies 134b, 134c is reduced. As a result, there is an increased chance that the stacked semiconductor assembly 110 (FIG. 1A) will have a short and/or an unacceptable bond in the die stack 130, either of which can cause the stacked semiconductor assembly 110 to be rejected during quality checks. Additionally, or alternatively, the reduced quality of the bonds can result in the hybrid bond failing over time, thereby shortening the lifespan of the stacked semiconductor assembly 110.

Figure 2A:
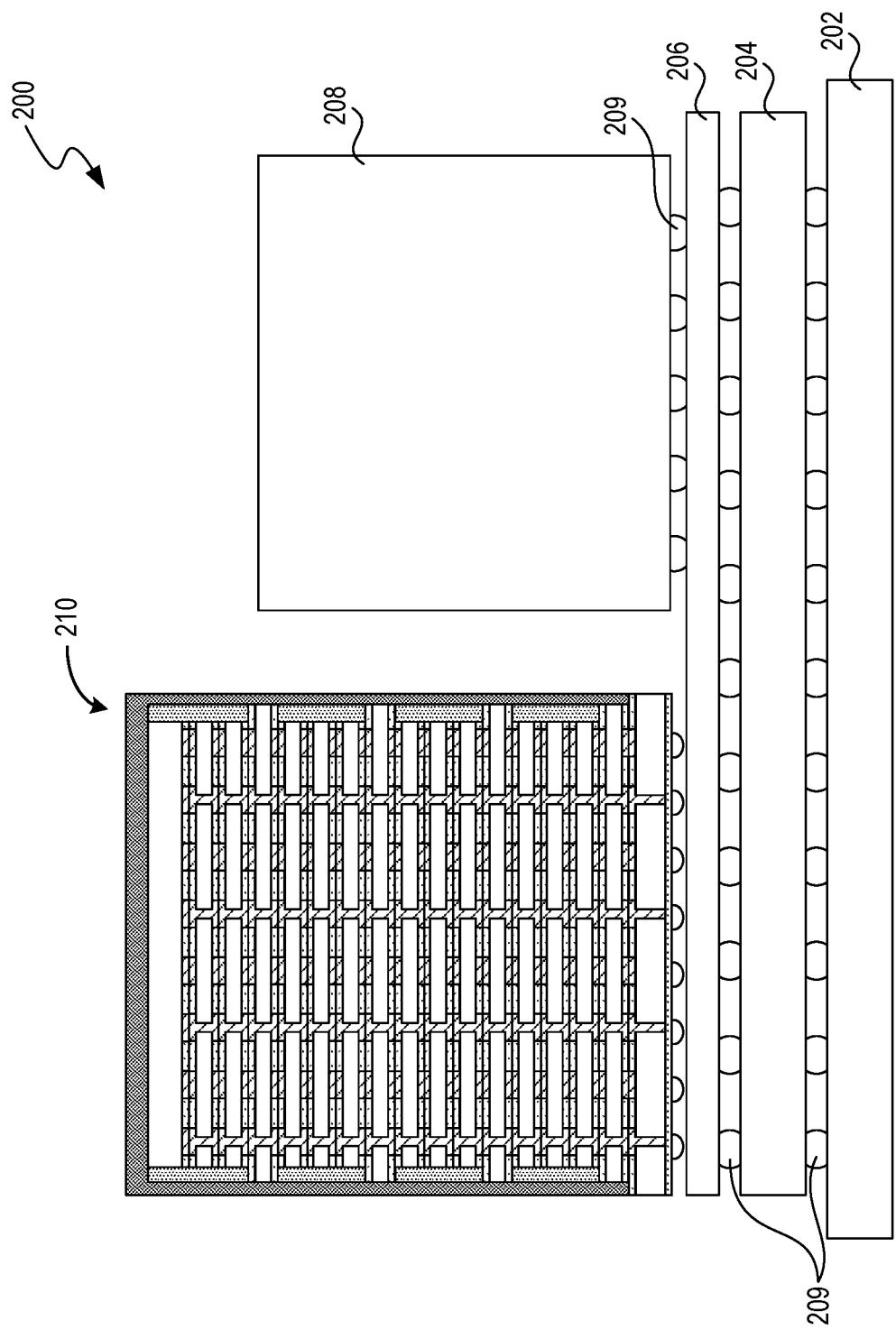
FIG. 2A is a cross-sectional view of a semiconductor device in accordance with some embodiments of the present technology.

FIG. 2A is a cross-sectional view of a semiconductor device 200 in accordance with some embodiments of the present technology. In the illustrated embodiment, the semiconductor device 200 includes a printed circuit board 202, a package substrate 204, an optional interposer 206, an application processor 208, and a modular stacked semiconductor assembly 210. The package substrate 204 is electrically coupled to the printed circuit board 202 through interconnects 209 (e.g., solder balls or other solder structures, bond pads, metal-metal bonds, and the like). Similarly, the interposer 206 is electrically coupled to the package substrate 204 through interconnects 209 while each of the application processor 208 and the modular stacked semiconductor assembly 210 are electrically coupled to the interposer 206.

Figure 2B:
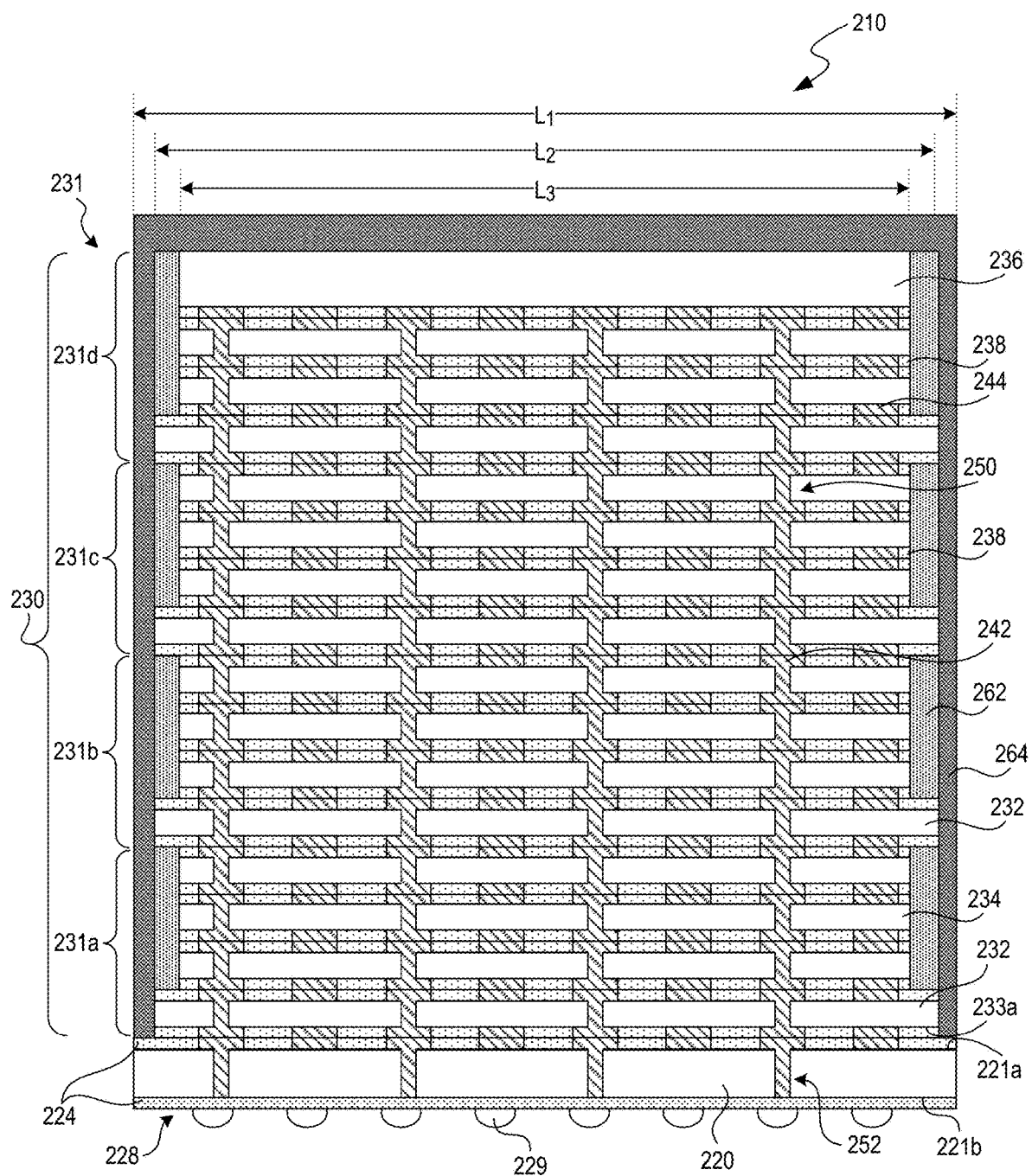
FIG. 2B is a cross-sectional view of the stacked semiconductor assembly from the semiconductor device of FIG. 2A in accordance with some embodiments of the present technology.

FIG. 2B is a cross-sectional view of the stacked semiconductor assembly 210 from the semiconductor device of FIG. 2A in accordance with some embodiments of the present technology. In the illustrated embodiment, the stacked semiconductor assembly 210 includes a lowermost die 220 that has a first surface 221a (e.g., an upper surface) and a second surface 221b (e.g., a lower surface) opposite the first surface 221a, each of which includes a dielectric layer 224. Similar to the dielectric layers discussed above, the dielectric layer 224 at the first and second surfaces 221a, 221b can be bonded to another dielectric in a hybrid bond.

For example, as further illustrated in FIG. 2B, the stacked semiconductor assembly 210 also includes a stack of semiconductor dies 230 (sometimes also referred to herein as a "die stack 230") that is hybrid bonded to the first surface 221a of the lowermost die 220. The die stack 230 can include one or more modules 231 (four shown, referred to individually as first-fourth modules 231a-231d, sometimes also referred to herein as "sub-stacks" of two or more dies). Each module contains one or more dies that are also bonded via hybrid bonds. For example, each of the first-fourth modules 231a-231d includes a base die 232 and one or more upper dies 234 carried by the base die 232. In the illustrated embodiment, each of the first-third modules 231a-231c includes three of the upper dies 234 carried by the base die 232 while the fourth module 231d includes two of the upper dies 234 and an uppermost die 236 (sometimes also referred to herein as a "top die"). That is, in the illustrated embodiment, the die stack 230 includes sixteen total dies that are grouped in modules that are carried by the lowermost die 220.

The lowermost die 220 has a first surface 221a (e.g., an upper surface) and a second surface 221b (e.g., a lower surface) opposite the first surface 221a. Each of the first surface 221a and the second surface 221b includes a dielectric layer 224 that can protect the lowermost die 220 and/or be directly bonded to another dielectric material. Similarly, each of the dies in the die stack 230 includes a dielectric layer 238 on the upper and lower surfaces of the dies that can protect the dies and/or be directly bonded to another dielectric material. For example, similar to the discussion above, the dielectric layer 224 on the first surface 221a is directly bonded to the dielectric layer 238 on a lower surface 233a of the base die 232 in the first module 231a.

Further, each of the dies in the stacked semiconductor assembly 210 includes one or more electric bond pads 242 and one or more thermal bond pads 244 that help facilitate the electrical, thermal, and physical bonding in the stacked semiconductor assembly 210. For example, the electric bond pads 242 (four shown) at the first surface 221a are directly bonded (e.g., through metal-metal bonds, such as copper-copper bonds) to the electric bond pads 242 (four shown) at the lower surface 233a of the base die 232 in the first module 231a. Similarly, the thermal bond pads 244 (four shown) at the first surface 221a are directly bonded to the thermal bond pads 244 (four shown) at the lower surface 233a of the base die 232. The direct bonds establish electrical and thermal communication between the lowermost die 220 and the first module 231a and/or contribute to the strength of the hybrid bonds between the lowermost die 220 and the first module 231a. As further illustrated in FIG. 2B, each of the base and upper dies 232, 234 includes one or more TSVs 250 (four shown for each of the base and upper dies 232, 234) extending between the electric bond pads 242 thereon. As a result, the TSVs 250 and the electric bond pads 242 form signal pathways from the lowermost die 220 to each of the dies in the die stack 230.

Further, the lowermost die 220 also includes one or more TSVs 252 coupled to the electric bond pads 242 and extending from the first surface 221a to the second surface 221b. At the second surface 221b, the TSVs 252 can be coupled to an optional redistribution layer 228. In turn, the redistribution layer 228 can be coupled to one or more (eight shown) package interconnects 229. The package interconnects can include solder structures (e.g., solder balls, solder columns, and the like), bond pads, conductive pillars, and/or any other suitable conductive structure. In various embodiments, the redistribution layer 228 can include any suitable number of signal routing lines, trace matching features, and the like. In some embodiments, the redistribution layer 228 is omitted and the TSVs 252 in the lowermost die 220 are directly coupled to the package interconnects 229 at the second surface 221b.

As discussed in more detail below, each of the modules 231 in the stacked semiconductor assembly 210 can be constructed and hybrid-bonded independently before being stacked on the lowermost die 220. The modular construction can reduce the temperature and/or pressure gradient across dies while most of the hybrid bonds are formed (e.g., the hybrid bonds within each of the modules 231). The reduction in the temperature and/or pressure gradient thereby improves the quality of the hybrid bonds that are formed. Purely by way of example, the number of voids 174 (FIG. 1B) that form between bond pads can be reduced (or eliminated).

Additionally, or alternatively, the modular construction can allow each module to be quality tested before being added to the die stack 230. For example, the quality tests can check the electrical and/or thermal performance of the hybrid bonds to ensure that there are an acceptable number of shorts and/or non-connections within each of the modules 231. In another example, the quality tests can check the strength of the bonds between the dies in each of the modules 231 (e.g., thereby ensuring an acceptable number of voids 172 (FIG. 1B) were formed).

As further illustrated in FIG. 2B, the modular construction can result in the dies in the stacked semiconductor assembly 210 having varying longitudinal footprints. For example, the lowermost die 220 has a first longitudinal footprint L1, the base die 232 of each of the modules 231 has a second longitudinal footprint L2, and each of the upper dies 234 and the uppermost die 236 have a third longitudinal footprint L3. The second longitudinal footprint L2 is smaller than the first longitudinal footprint L1 (e.g., the base die 232 has a smaller length and/or width than the lowermost die 220); and the third longitudinal footprint L3 is smaller than the second longitudinal footprint L2 (e.g., the upper dies 234 have a smaller length and/or width than the base die 232).

In addition to the varying longitudinal footprints, the stacked semiconductor assembly 210 can include multiple encapsulants. For example, as illustrated in FIG. 2B, each of the modules 231 can include a first encapsulant 262 covering the sidewalls of the upper dies 234 and the uppermost die 236, while the stacked semiconductor assembly 210 can include a second encapsulant 264 covering the sidewalls and/or an uppermost surface of die stack 230. In the illustrated embodiment, the first encapsulant 262 is contained within the second longitudinal footprint L2 of each of the base dies 232 while the second encapsulant 264 is contained within the first longitudinal footprint L1 of the lowermost die 220. Each of the first and second encapsulants 262, 264 can be any suitable molding material to insulate and/or protect the die stack 230, and the dies therein from damage during and/or after manufacturing. In some embodiments, the first and second encapsulants 262, 264 are the same encapsulant with a vertical interface where the second encapsulant 264 is applied to the first encapsulant 262 after the first encapsulant 262 has been cured. In some embodiments, the first and second encapsulants 262, 264 are different encapsulants with a vertical interface where the different encapsulants meet.

It will be understood by one of skill in the art, however, that the modular construction process can be modified to reduce (or eliminate) the variance in longitudinal footprints, if desired. For example, in some such embodiments, a singulation process for each module can cut closer to (or at) the sidewalls of the upper dies 234 and/or the uppermost die 236 (e.g., such that the base die 232 has the same length and/or width as each of the upper dies 234 and/or the uppermost die 236) and the first encapsulant 262 can be omitted. As a result, the sidewalls of the upper dies 234 and/or the uppermost die 236 can be exposed to the singulation process and/or during the module-stacking process. The exposure can create a greater risk of damage to the dies in each of the modules 231 during manufacturing, but can nevertheless capture the advantages of the modular construction process.

It will also be understood that the modular construction process can result in module-level variances in alignment. For example, although the first and second modules 231a, 231b are illustrated as perfectly aligned in FIG. 2B, the second module 231b can be lightly offset from the first module 231a in a longitudinal direction. As a result, for example, the sidewalls of the first module 231a can be longitudinally offset (e.g., not vertically aligned) from the sidewalls of the second module 231b. Additionally, or alternatively, the sidewalls of the second module 231b can be longitudinally offset from the sidewalls of the third module 231c. Further, the direction and/or magnitude of the offset between adjacent pairs of the modules 231 (e.g., between the first and second modules 231a, 231b, the second and third modules 231c, 231d) can vary for each pair of the modules 231.

Figure 3A:
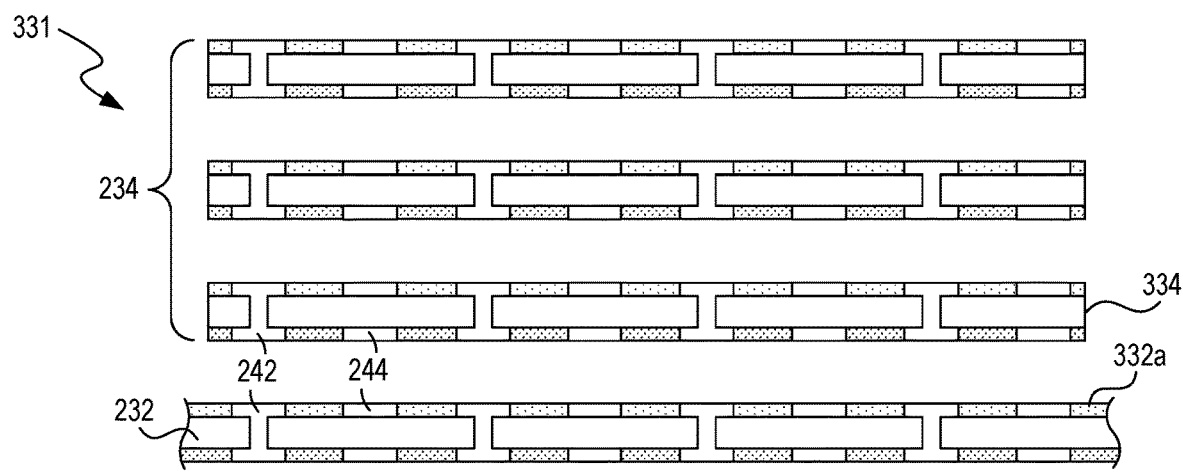
FIGS. 3A-3C are cross-sectional views of a process for constructing a module of the type used in a stacked semiconductor assembly in accordance with some embodiments of the present technology.
Figure 3B:
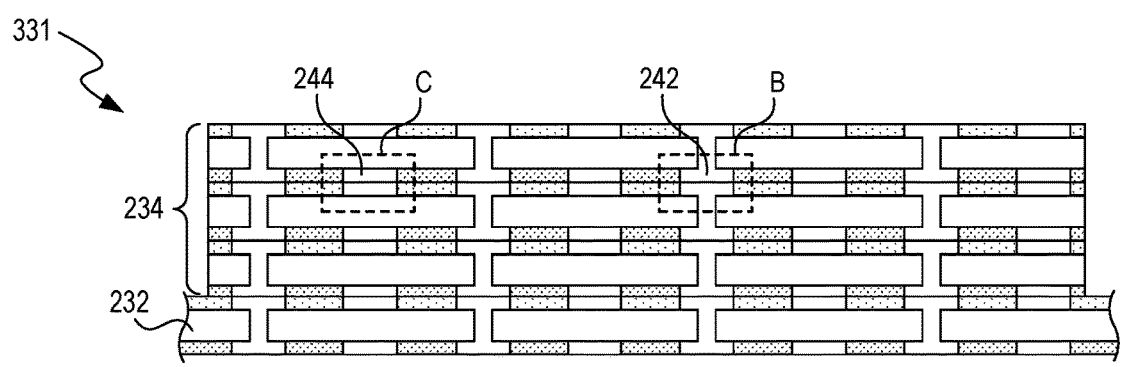
Figure 3C:
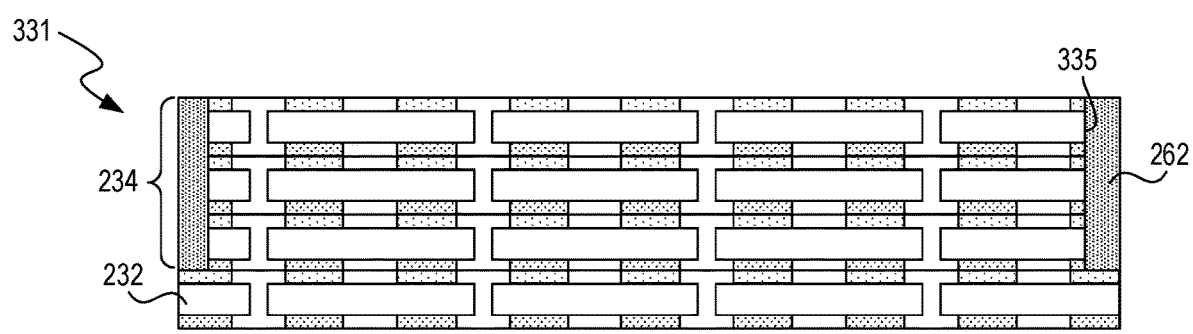

FIGS. 3A-3C are cross-sectional views of a process for constructing a module 331 of the type used in a stacked semiconductor assembly 210 (FIG. 2B) in accordance with some embodiments of the present technology. In the illustrated embodiment, the module 331 resulting from the illustrated process is similar to the first-third modules 231a-231c discussed above with reference to FIG. 2B. For example, the module 331 includes a base die 232 and one or more upper dies 234 (three shown).

FIG. 3A illustrates the module 331 during a stacking process that stacks the upper dies 234 on an upper surface 332a of the base die. Each of the upper dies 234 can be pre-singulated while the base die 232 can be a part of a larger wafer. Accordingly, in some embodiments, the stacking process can be executed for multiple modules 331 on the wafer at the same time (e.g., stacking one or more upper dies 234 on each corresponding base die 232 at once).

As further illustrated in FIG. 3A, the stacking process can include aligning the electric bond pads 242 and/or the thermal bond pads 244 on each of the dies. For example, the electric and thermal bond pads 242, 244 on a lowermost upper die 334 are aligned with the electric and thermal bond pads 242, 244 on the base die 232 before the lowermost die 334 is placed on the upper surface 332a of the base die 232.

FIG. 3B illustrates the module 331 after the base and upper dies 232, 234 have been hybrid bonded together. The hybrid bonding process can include applying heat and/or a compression force (e.g., pressure) to the base and upper dies 232, 234. As a result, for example, the electric bond pads 242 in region B and the thermal bond pads 244 in region C can form metal-metal bonds. The metal-metal bonds can be copper-copper, gold-gold, silver-silver, and/or any other suitable metal-metal bond. Further, the heat and/or pressure can cause the dielectric layers 238 between each of the base and upper dies 232, 234 to bond together.

Because the module 331 is more compact (e.g., shorter, includes fewer dies, etc.) than, for example, the die stack 130 discussed above with respect to FIG. 1A, the hybrid bonding process on the module 331 can be more successful. Purely by way of example, the shorter die stack in the module 331 can result in a relatively small temperature gradient across the module 331. The relatively small temperature gradient results in fewer voids (e.g., the void 174 discussed above with reference to FIG. 1B) forming between bond pads. Further, the fewer elements in the module 331 can allow each surface to be more thoroughly cleaned during the hybrid bonding process. As a result, fewer particles may be present to create voids (e.g., the void 172 discussed above with reference to FIG. 1B) between the dielectric layers. Indeed, the inventors have realized that the modular process can reduce the number of failures significantly, especially for large die stacks. For example, the inventors have realized that for a stacked semiconductor assembly sixteen total dies, the modular process can increase the yield of a process by 25% overall.

Still further, the modular process allows the module 331 can be tested (e.g., electrically, thermally, and/or physically) after the hybrid bonding process. By testing the module, the modular process can improve the overall yield of a manufacturing process by omitting the module 331 (and/or any related modules) if it fails the testing, the modular process can further improve the yield of the overall manufacturing process.

FIG. 3C illustrates the module 331 after the first encapsulant 262 has been deposited to protect sidewalls 335 of the upper dies 234. The first encapsulant 262 can be deposited over the upper surface 332a of the base die 232 in any suitable, wafer level-process. For example, the first encapsulant 262 can be flowed over the upper dies 234, cured, and etched to re-expose an uppermost surface of the upper dies; the first encapsulant 262 can be injected by an injection molding process; and/or deposited in any other suitable process. Once the first encapsulant 262 is deposited and cured, the module 331 can be singulated from the wafer. Additional details on the singulation process are described below with reference to FIGS. 6A and 6B.

Figure 4A:
FIGS. 4A-4C are cross-sectional views of a process for constructing a module of the type used in a stacked semiconductor assembly in accordance with further embodiments of the present technology.
Figure 4B:
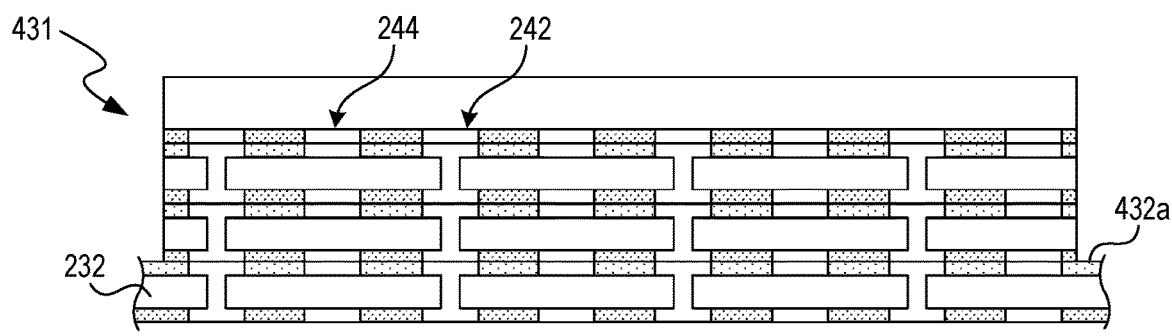
Figure 4C:
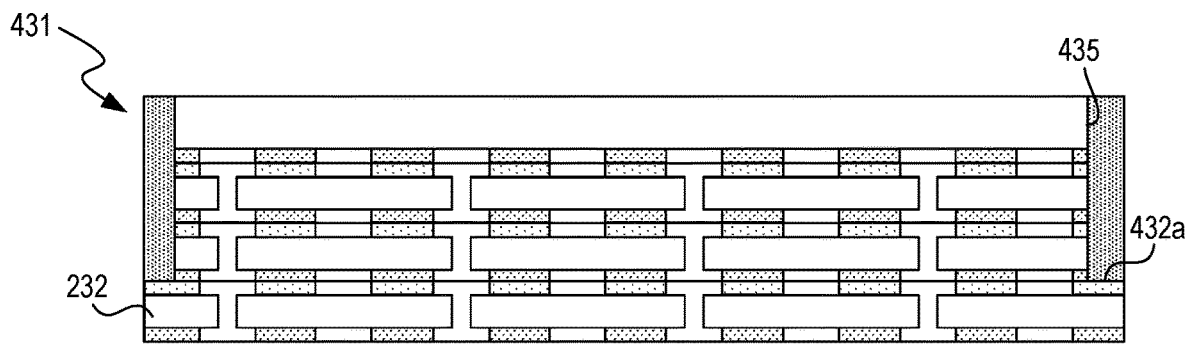

FIGS. 4A-4C are cross-sectional views of a process for constructing a module 431 of the type used in a stacked semiconductor assembly 210 (FIG. 2B) in accordance with further embodiments of the present technology. In the illustrated embodiment, the module 431 resulting from the process is similar to the fourth module 231d discussed above with reference to FIG. 2B. For example, the module 431 includes a base die 232, one or more upper dies 234 (two shown), and an uppermost die 236. Further, as illustrated in FIGS. 4A-4C, the stacking process is generally similar to the stacking process described above with reference to FIGS. 3A-3C altered to include the uppermost die 236.

For example, FIG. 4A illustrates the module 431 while stacking each of the upper dies 234 and the uppermost die 236 on an upper surface 432a of the base die 232. Each of the upper dies 234 and the uppermost die 236 is pre-singulated while the base die 232 is part of a larger wafer. Accordingly, in some embodiments, the stacking process can be executed for multiple modules 431 on the wafer at the same time.

FIG. 4B illustrates the module 431 after hybrid bonding the base, upper, and uppermost dies 232, 234, 236 together. As discussed above, the hybrid bonding process can include applying heat and/or a compression force (e.g., pressure) to the base, upper, and uppermost dies 232, 234, 236. As a result, the electric bond pads 242 and the thermal bond pads 244 can form metal-metal bonds while the dielectric layers 248 are at least partially fused together.

Similar to the discussion above, because the module 431 is more compact (e.g., shorter, includes fewer dies, etc.) than, for example, the die stack 130 discussed above with respect to FIG. 1A, the hybrid bonding process on the module 431 can be more successful. Purely by way of example, the shorter die stack in the module 431 can result in a relatively small temperature gradient across the module 431. The relatively small temperature gradient results in fewer voids (e.g., the void 174 discussed above with reference to FIG. 1B) forming between bond pads.

Further, the modular process allows the module 431 can be tested (e.g., electrically, thermally, and/or physically) after the hybrid bonding process. By testing the module, the modular process can improve the overall yield of a manufacturing process by omitting the module 431 (and/or any related modules) if it fails the testing, the modular process can further improve the yield of the overall manufacturing process.

FIG. 4C illustrates the module 431 after the first encapsulant 262 has been deposited around sidewalls 435 of the upper and uppermost dies 234, 236. As discussed above, the first encapsulant 262 can be deposited over the upper surface 432a of the base die 232 in any suitable wafer-level process. Once the first encapsulant 262 is deposited and cured, the module 431 can be singulated from the wafer.

Figure 5A:
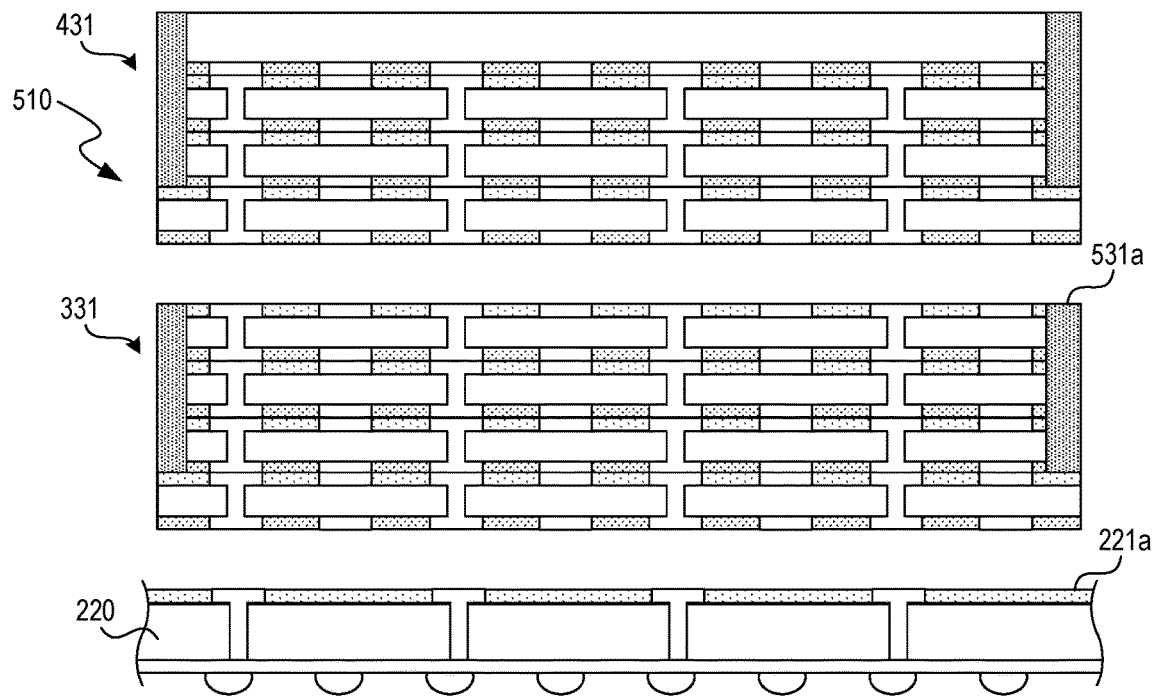
FIGS. 5A-5C are cross-sectional views of a process for constructing a stacked semiconductor assembly using modules of the type constructed in FIGS. 3A-4C in accordance with some embodiments of the present technology.
Figure 5B:
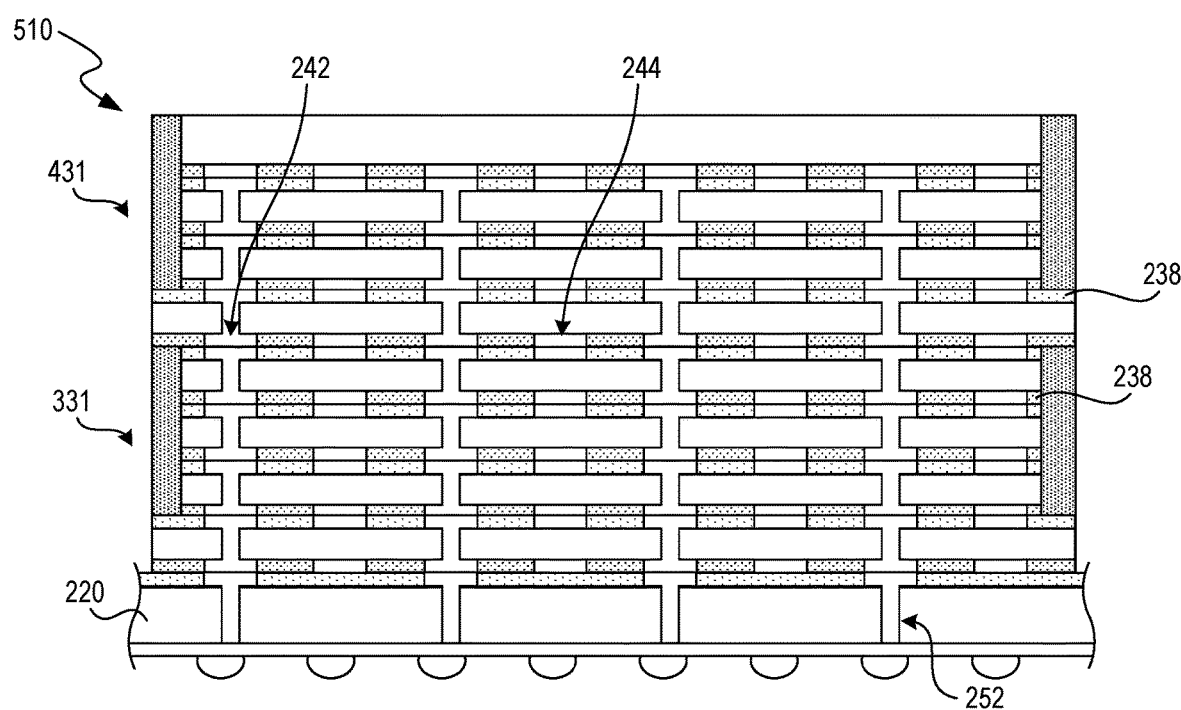
Figure 5C:
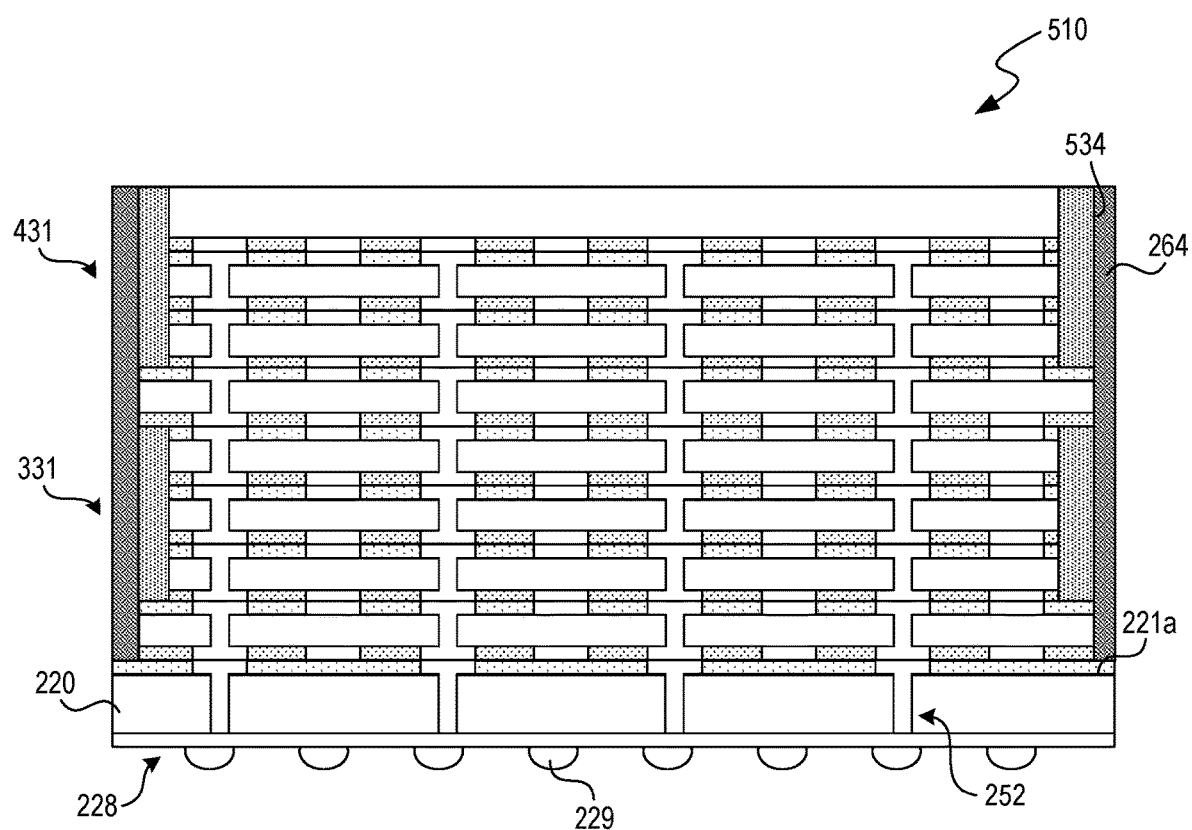

FIGS. 5A-5C are cross-sectional views of a process for constructing a stacked semiconductor assembly 510 using the modules 331, 431 of the type constructed in FIGS. 3A-4C in accordance with some embodiments of the present technology. In the illustrated embodiment, the process is generally similar to the processes discussed above with respect to FIGS. 3A-4C.

For example, FIG. 5A illustrates the stacked semiconductor assembly 510 while stacking each of the modules 331, 431 onto the lowermost die 220. In the illustrated embodiment, the module 331 resulting from the process of FIGS. 3A-3C (also referred to herein as a "first module 331") is stacked on the first surface 221a (e.g., the upper surface) of the lowermost die 220 and the module 431 resulting from the process of FIGS. 4A-4C (also referred to herein as a "second module 431") is stacked on an upper surface 531a of the first module 331. Similar to the discussion above, the first and second modules 331, 431 can be pre-singulated while the lowermost die 220 is included in a wafer. Accordingly, in some embodiments, the stacking process can be executed for multiple modules 331 on the wafer at the same time (e.g., stacking one or more modules 331, 431 on each corresponding lowermost die 220 at once).

FIG. 5B illustrates the stacked semiconductor assembly 510 after the lowermost die 220, the first module 331, the second module 431 have been hybrid bonded together. As discussed above, the hybrid bonding process can include applying heat and/or a compression force (e.g., pressure) to the lowermost die 220, the first module 331, the second module 431. As a result, for example, the electric and thermal bond pads 242, 244 interfacing between the first and second modules 331, 341 can form metal-metal bonds. Further, the heat and/or pressure can cause the dielectric layers 238 between each of the lowermost die 220, the first module 331, the second module 431 to bond together.

Because many of the hybrid bonds have already been formed (and sometimes checked), the hybrid bonding process applied to the stacked semiconductor assembly 510 is less likely to result in faulty bonds. For example, the hybrid bonding process need only to monitor and clean the interface between the lowermost die 220 and the first module 331 and the interface between the first module 331 and the second module 431 to reduce the number of particle-induced voids that form between dielectric layers 238. Further, because many (or most) of the metal-metal bonds have already been formed, the hybrid bonding process can have a lower chance of voids (e.g., the void 174 of FIG. 1B) forming to impair the electrical signal routes in the stacked semiconductor assembly 510. Indeed, as discussed above, the inventors have realized that for a stacked semiconductor assembly sixteen total dies, the modular process can increase the yield of a process by 25% overall.

FIG. 5C illustrates the stacked semiconductor assembly 510 after the second encapsulant 264 has been deposited around sidewalls 534 of the first and second modules 331, 431. Similar to the discussion above, the second encapsulant 264 can be deposited over the first surface 221a of the lowermost die 220 in any suitable wafer-level process. Once the second encapsulant 264 is deposited and cured, the stacked semiconductor assembly 510 can be singulated from the wafer. Additional details on the singulation process are described below with reference to FIGS. 6C and 6B.

Figure 6A:
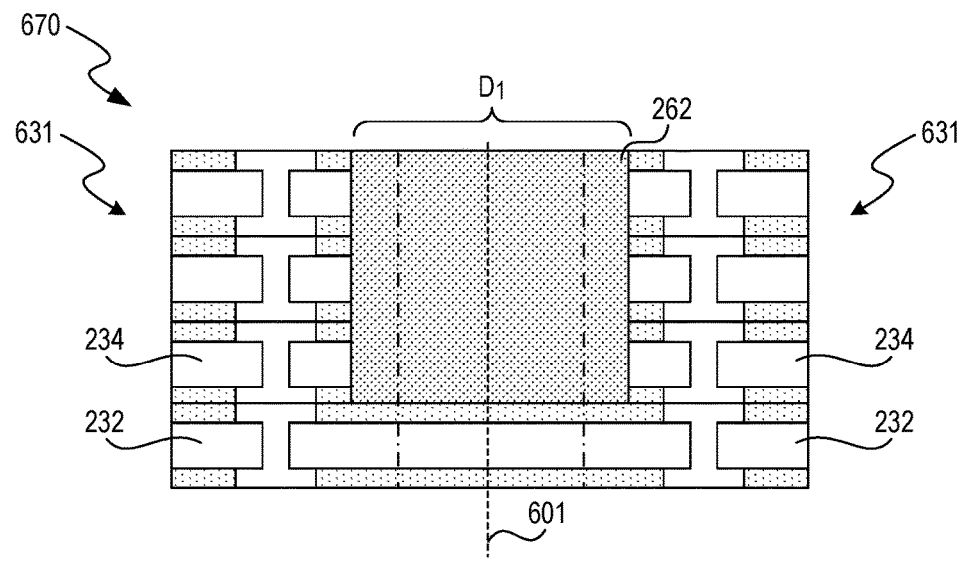
FIG. 6A is a cross-sectional view of a region of a wafer used to construct modules of the type illustrated in FIGS. 3A-4C in accordance with some embodiments of the present technology.
Figure 6B:
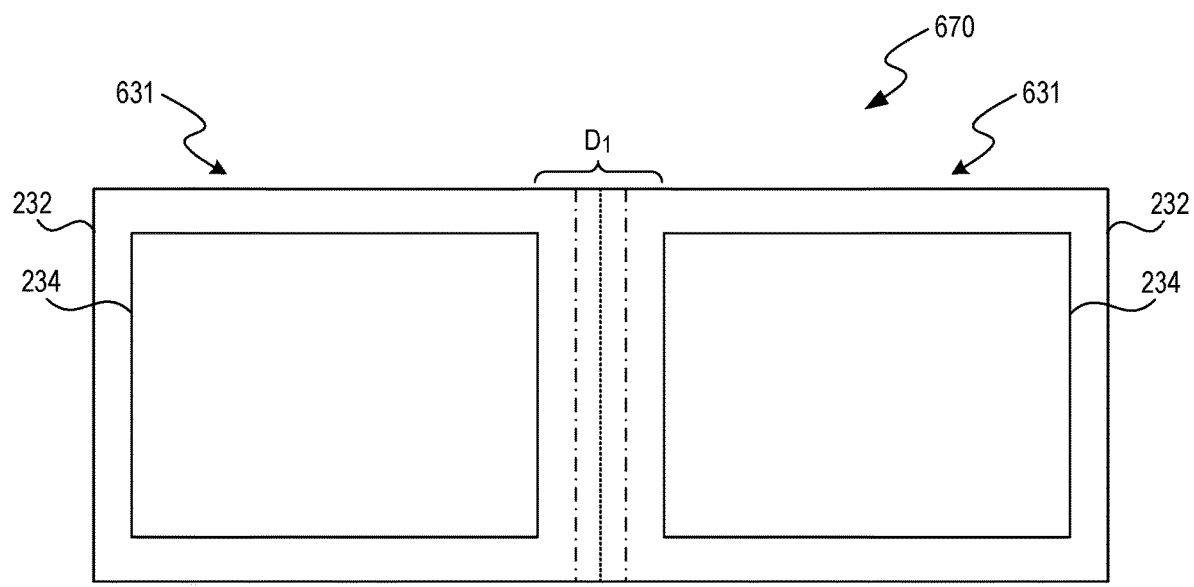
FIG. 6B is a top plan view of the wafer of FIG. 6A in accordance with some embodiments of the present technology.

FIGS. 6A and 6B are a cross-sectional view and a top plan view, respectively, of a region of a wafer 670 used to manufacture modules of the type illustrated in FIGS. 3A-4C in accordance with some embodiments of the present technology. As best illustrated in FIG. 6A, the wafer 670 includes multiple (two shown) base dies 232 related to modules 631 generally similar to the modules 331 discussed above with respect to FIGS. 3A-3C. For example, each of the modules 631 includes the base die 232, one or more (three shown) upper dies 234, and a first encapsulant 262 surrounding the upper dies 234.

As illustrated in both FIGS. 6A and 6B, the base dies 232 of each of the modules 631 are separated by distance $D_1$. Further, the distance $D_1$ between the base dies 232 can be smaller than the distance between the upper dies 234 in each of the modules 631. Accordingly, the distance $D_1$ provides room for singulation along a line 601 between the modules 631 without risking damage (e.g., die cracking, incidental dicing, and the like) to the upper dies 234. For example, a singulation process can separate the modules 631 along the line 601 while the first encapsulant 262 protects the upper dies 234 from damage. In various embodiments, the singulation process can include a blade dicing process, a scribe-dicing process, a laser dicing process, a plasma dicing process, and/or any other suitable process.

Figure 6C:
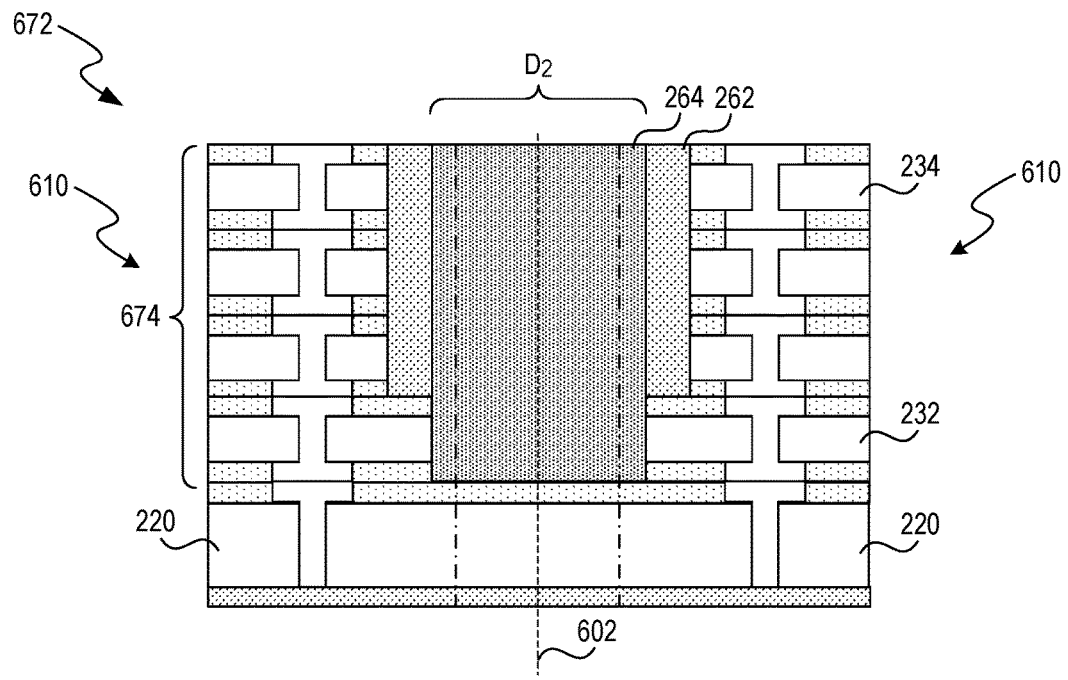
FIG. 6C is a cross-sectional view of a region of a wafer used to construct stacked semiconductor assemblies of the type illustrated in FIGS. 5A-5C in accordance with some embodiments of the present technology.
Figure 6D:
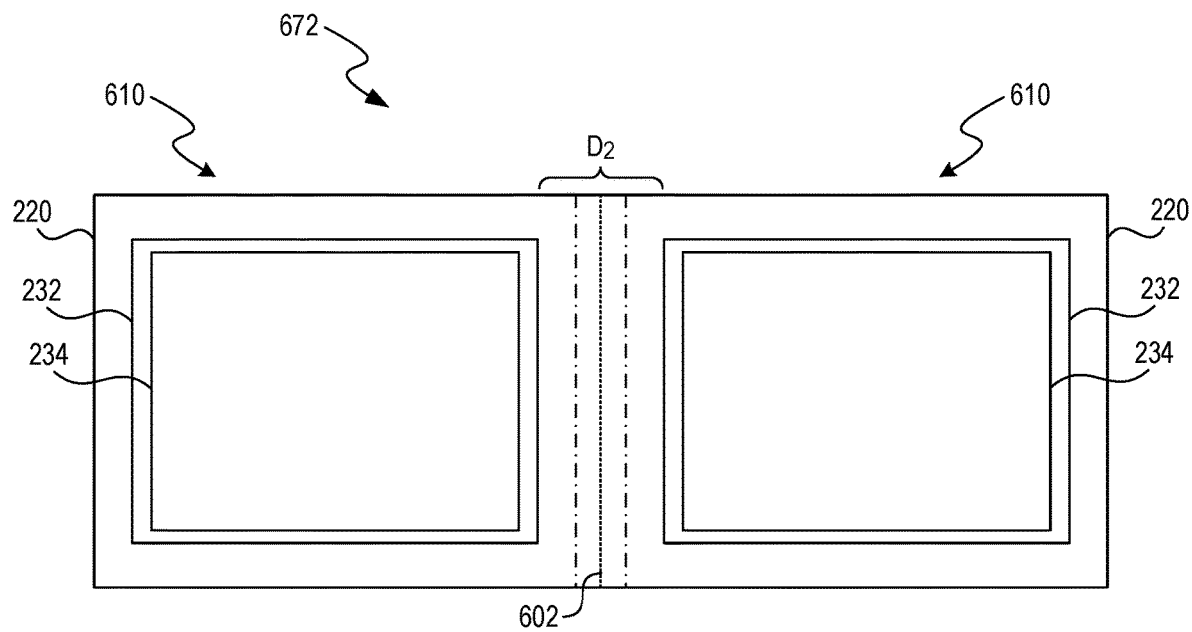
FIG. 6D is a top plan view of the wafer of FIG. 6C in accordance with some embodiments of the present technology.

FIGS. 6C and 6D are a cross-sectional view and a top plan view, respectively, of a region of a wafer 672 used to manufacture stacked semiconductor assemblies of the type illustrated in FIGS. 5A-5C in accordance with some embodiments of the present technology. As best illustrated in FIG. 6C, the wafer 672 includes multiple (two shown) lowermost dies 220 related to individual stacked semiconductor assemblies 610 generally similar to the stacked semiconductor assemblies 510 discussed above with respect to FIGS. 5A-5C. For example, each of the stacked semiconductor assemblies 510 includes the lowermost die 220, one or more modules 674 (two shown, one labeled) carried by the lowermost die 220, and a second encapsulant 264 surrounding the module(s) 674. Further, the module(s) 674 illustrated in FIG. 6C includes a base die 232, one or more (three shown) upper dies 234, and a first encapsulant 262 surrounding the upper dies 234.

Similar to the discussion above, and as illustrated in both FIGS. 6C and 6D, the lowermost die 220 of each of the stacked semiconductor assemblies 610 are separated by distance $D_2$. Further, the distance $D_2$ between the lowermost dies 220 can be smaller than the distance between the modules 731 in each of the stacked semiconductor assemblies 610. Accordingly, the distance $D_2$ provides room for singulation along a line 602 between the stacked semiconductor assemblies 610 without risking damage (e.g., die cracking, incidental dicing, and the like) to the modules 674. For example, a singulation process can separate the stacked semiconductor assemblies 610 along the line 602 while the second encapsulant 264 protects the modules 674 from damage.

Figure 7A:
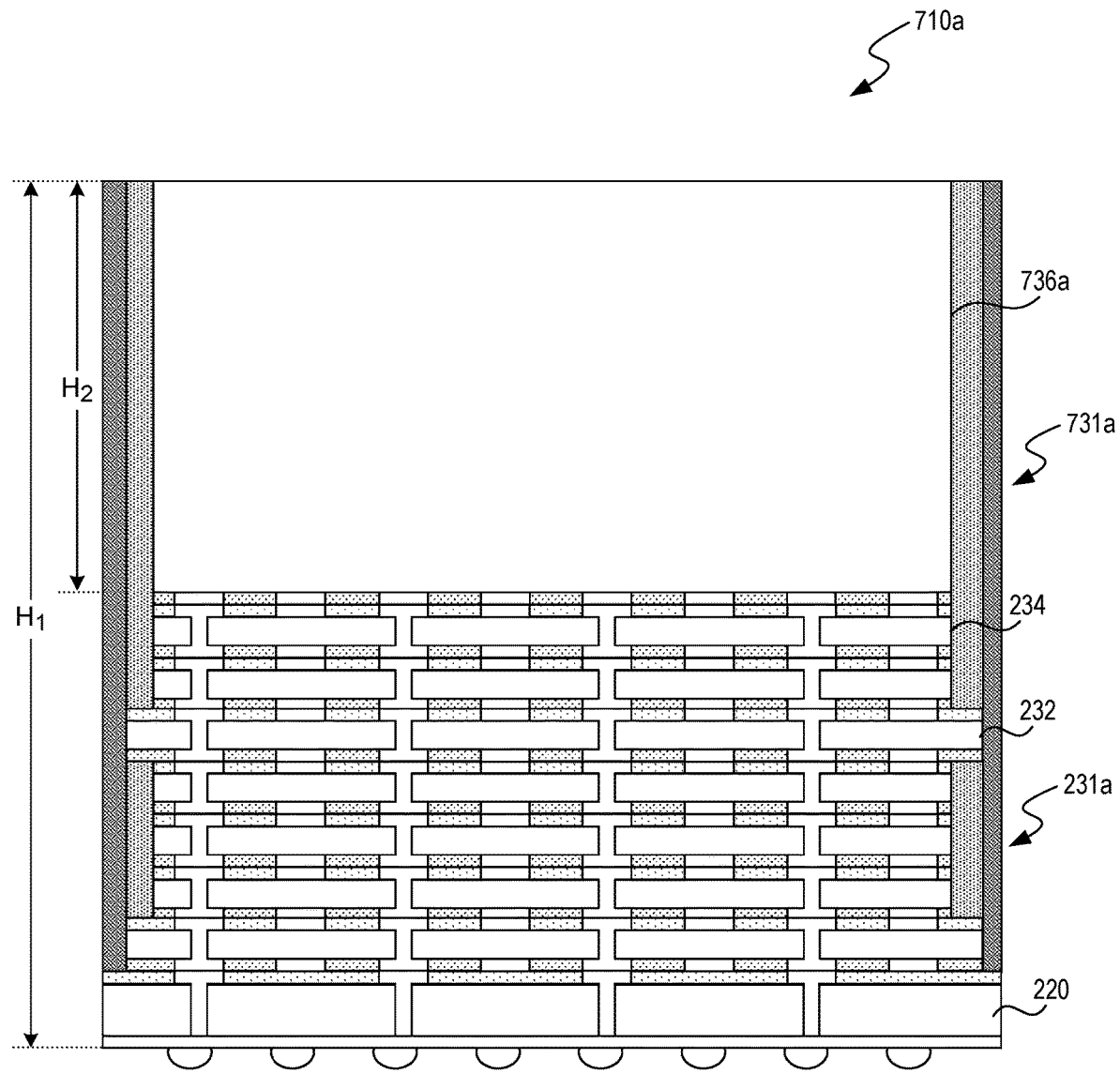
FIGS. 7A and 7B are cross-sectional views of stacked semiconductor assemblies in accordance with further embodiments of the present technology.
Figure 7B:
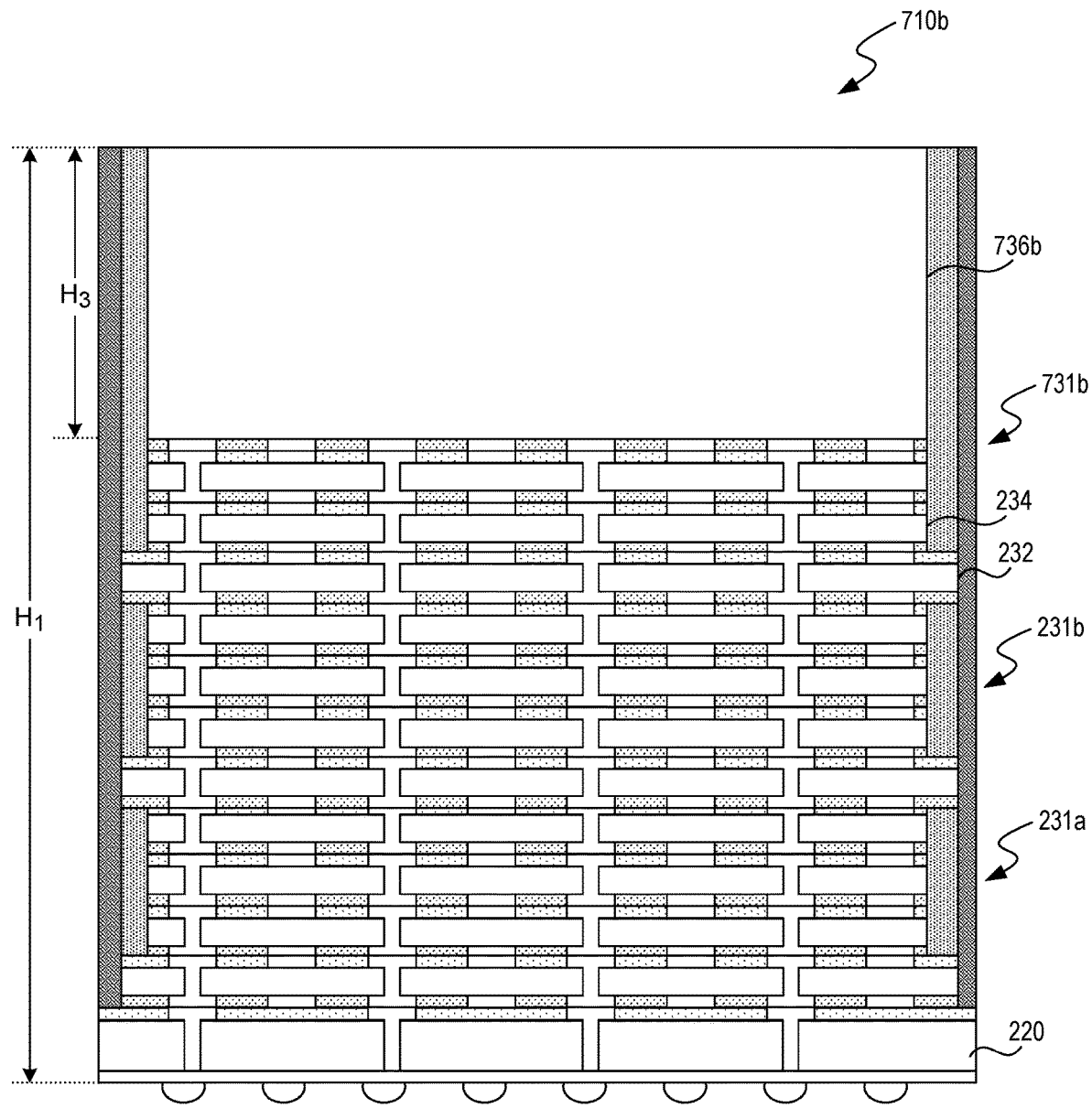

FIGS. 7A and 7B cross-sectional views of first and second stacked semiconductor assemblies 710a, 710b in accordance with further embodiments of the present technology. As illustrated in FIGS. 7A and 7B, the first and second stacked semiconductor assemblies 710a, 710b are generally similar to the stacked semiconductor assembly 210 discussed above with respect to FIG. 2B. For example, the first and second stacked semiconductor assemblies 710a, 710b each include a lowermost die 220 and one or more modules carried by the lowermost die 220. However, in the illustrated embodiments, the number of modules, as well as the dies included in some of the modules, is varied in order to match an overall height $H_1$ of the first and second stacked semiconductor assemblies 710a, 710b to a predetermined height (e.g., a standard and/or desired height for the first and second stacked semiconductor assemblies 710a, 710b).

For example, in the embodiment illustrated in FIG. 7A, the first stacked semiconductor assembly 710a includes two modules: a first module 231a carried by the lowermost die 220 that is generally similar to the first module 231a discussed above with respect to FIG. 2B; and a second module 731a (e.g., an uppermost module) carried by the first module 231a. The second module 731a includes a base die 232, two upper dies 234, and uppermost die 736a which has a second height $H_2$. The second height $H_2$ can be varied and/or selected (e.g., based on the remaining features in the first stacked semiconductor assembly 710a) to match the overall height $H_1$ of the first stacked semiconductor assembly 710a to the predetermined height.

In another example, in the embodiment illustrated in FIG. 7B, the second stacked semiconductor assembly 710b includes three modules: first and second modules 231a, 231b that are generally similar to the first and second modules 231a, 231b discussed above with respect to FIG. 2B; and a third module 731b (e.g., an uppermost module) carried by the second module 231b. Similar to the second module 731a (FIG. 7A), the third module 731b includes a base die 232, two upper dies 234, and uppermost die 736b that has a third height $H_3$. The third height $H_3$ can be varied and/or selected to match the overall height $H_1$ of the second stacked semiconductor assembly 710b to the predetermined height. For example, the third height $H_3$ is smaller than the second height $H_2$ of the second module 731a (FIG. 7A) because the second stacked semiconductor assembly 710b includes an additional module (and additional dies) and therefore is closer to the predetermined height before selecting the third height $H_3$ for the uppermost die 736b.

It will be understood that, in various other embodiments, the height of an uppermost die in a stacked semiconductor assembly can be selected to any other suitable height. Additionally, or alternatively, it will be understood that a stacked semiconductor assembly can include multiple modules with height-adjusting dies similar to the uppermost dies discussed with reference to FIGS. 7A and 7B. For example, in some embodiments, the stacked semiconductor assembly includes two modules, each of which includes a height-adjusting die in order to match the overall height of the stacked semiconductor assembly to a predetermined height. In a specific, non-limiting example, the stacked semiconductor assembly can include two modules. The first module can have a base die and a height-adjusting die carried by the base die while the second module can include a base die, three upper dies, and a height-adjusting die carried by the upper dies.

Figure 8:
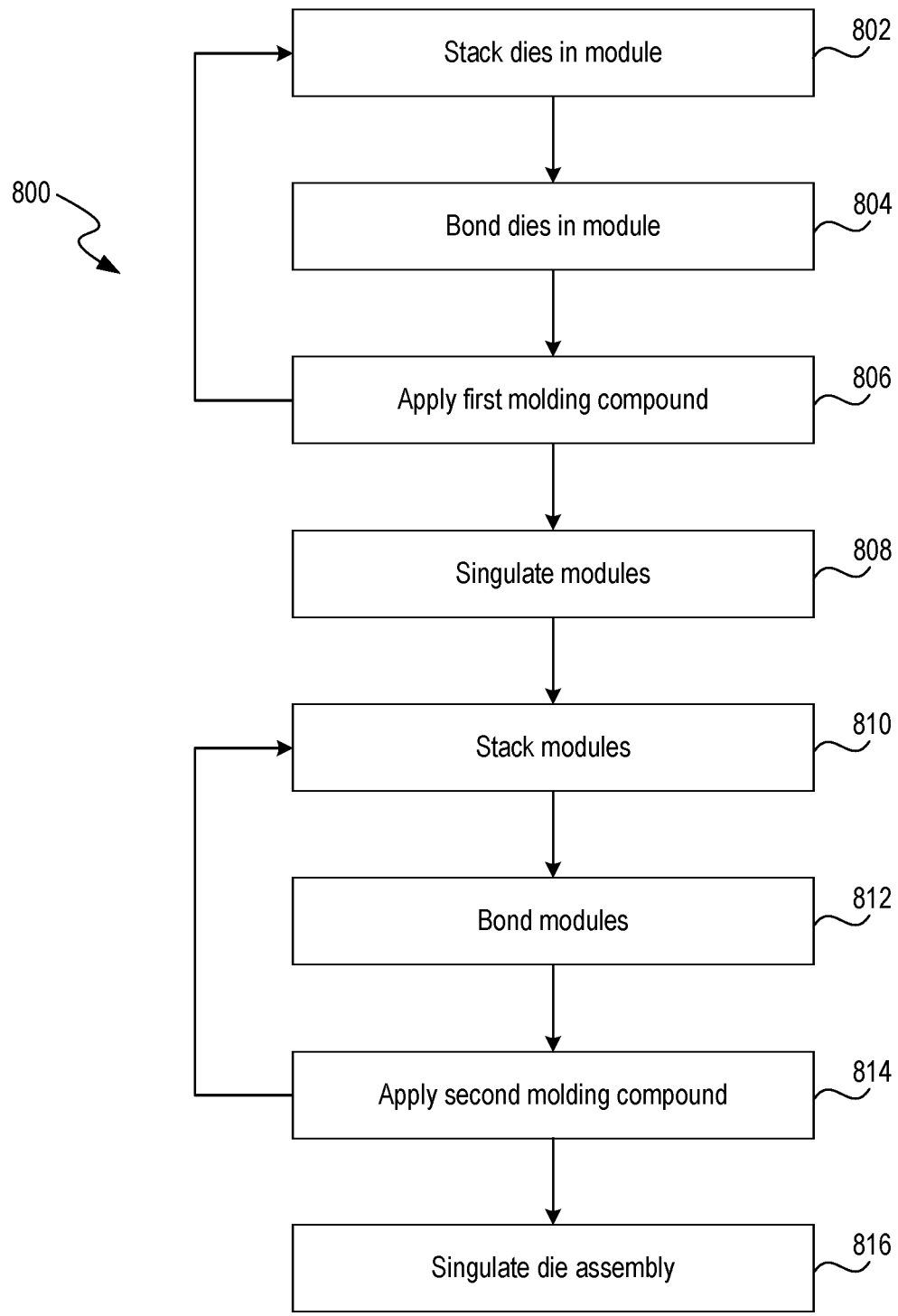
FIG. 8 is a flow diagram of a process for constructing stacked semiconductor assemblies in accordance with some embodiments of the present technology.

FIG. 8 is a flow diagram of a process 800 for constructing stacked semiconductor assemblies in accordance with some embodiments of the present technology. In the illustrated embodiment, the process 800 begins at block 802 by stacking one or more dies for a module onto a base die (e.g., as illustrated above with respect to FIGS. 3A and 4A). Each of the modules can include the base die, one or more upper dies, and/or one or more height-adjusting dies. Further, stacking each of the dies in the module can include aligning an array of electric and/or thermal bond pads between each of the dies as they are stacked. The stacking process can then form direct contact between the electric and/or thermal bond pads at the interface between the dies as they are stacked (e.g., between bond pads on a first die of the one or more upper die and the base die, between bond pads on interfacing dies in the one or more upper dies and/or the uppermost die, and the like). In some embodiments, the stacking is done at a wafer scale and one or more dies are stacked on a plurality of base dies at a single time. In some wafer-scale embodiments, however, the stacking is done for each corresponding base die sequentially (e.g., dies are stacked on a first base die then dies are stacked on a second base die).

At block 804, the process 800 includes hybrid bonding the dies in the module(s) (e.g., as illustrated above with respect to FIGS. 3B and 4B). As discussed above, the hybrid bonding process can include applying heat and/or pressure to the dies in the module(s). The heat and/or pressure cause metal-metal bonds to form between the electric and/or thermal bond pads while the dielectric layers on each of the dies at least partially fuse. In a wafer-level process, the heat and/or pressure can be applied to each of the modules on the wafer at once or sequentially to one or more modules at a time.

At block 806, the process 800 includes applying a first encapsulant (e.g., a first molding compound) to the module(s) (e.g., as illustrated above with respect to FIGS. 3C and 4C). In a wafer-level process, the first encapsulant can be deposited across the entire wafer at one time. In some embodiments, the deposition process at block 806 includes a subsequent thinning process to expose and/or polish an uppermost surface of the module(s) (e.g., thereby exposing and cleaning the bond pads and dielectric layer of an upper die in the module). In some embodiments, the deposition process at block 806 includes a controlled process (e.g., a mold injection process) that can avoid a need to thin the first encapsulant after the deposition. In some such embodiments, however, the deposition process still includes cleaning the uppermost surface of the module(s).

As illustrated in FIG. 8, the process 800 can then return to block 802 to produce one or more additional modules. For example, in sequential wafer-level processes, the process 800 can return to block 802 to produce additional modules elsewhere on the wafer. In another example, the process 800 can return to block 802 to produce additional modules on a second wafer after completing processing on a first wafer. Else the process 800 can proceed to block 808.

At block 808, the process 800 includes singulating the modules (e.g., as illustrated above with respect to FIGS. 6A and 6B). As discussed above, in various embodiments, the singulation can include a blade dicing process, a scribe-dicing process, a laser dicing process, a plasma dicing process, and/or any other suitable process to separate module(s) from surrounding materials, such as other modules, excess semiconductor substrate, and the like. In some embodiments, the process 800 can then return to block 802 to produce one or more additional modules (e.g., rather than after block 806). Else the process 800 can proceed to block 810.

At block 810, the process 800 includes stacking one or more modules on a lowermost die for a corresponding stacked semiconductor assembly (e.g., as illustrated above with respect to FIG. 5A). Stacking each of the modules can include aligning an array of electric and/or thermal bond pads between each of the modules as they are stacked. In some embodiments, the stacking is done at a wafer scale (e.g., a wafer including a plurality of lowermost dies) and one or more modules are stacked on the plurality of lowermost dies at a single time. Further, stacking each of the modules can include aligning one or more electric and/or thermal bond pads between each of the modules as they are stacked. The stacking process can then form direct contact between the electric and/or thermal bond pads at the interface between the modules and/or at the interface between a lowermost module and the lowermost die. In some wafer-scale embodiments, however, the stacking is done for each corresponding lowermost die sequentially. In some embodiments, the stacking process at block 810 includes stacking a singular die on the lowermost die in addition to the one or more modules. For example, the process 800 can include stacking a first module on the lowermost die, stacking an individual die on the first module, then stacking a second module on the individual die.

At block 812, the process 800 includes hybrid bonding each of the modules and the lowermost die together (e.g., as illustrated above with respect to FIG. 5B). As discussed above, the hybrid bonding process can include applying heat and/or pressure to the module(s) in the stacked semiconductor assembly. In a wafer-level process, the heat and/or pressure can be applied to each of the stacked semiconductor assemblies on the wafer at once or sequentially to one or more stacked semiconductor assemblies at a time.

At block 814, the process 800 includes applying a second encapsulant (e.g., a second molding compound) to each of the stacked semiconductor assemblies (e.g., as illustrated above with respect to FIG. 5C). Similar to the discussion above, in a wafer-level process, the second encapsulant can be deposited across the entire wafer at one time. In some embodiments, the deposition process at block 814 includes a subsequent thinning process to adjust an overall height of the stacked semiconductor assemblies. In some embodiments, the deposition process at block 806 includes a controlled process (e.g., a mold injection process) that can avoid the need to thin the second encapsulant after the deposition.

As illustrated in FIG. 8, the process 800 can then return to block 810 to produce one or more additional stacked semiconductor assemblies. For example, in sequential wafer-level processes, the process 800 can return to block 810 to produce additional stacked semiconductor assemblies elsewhere on the wafer. In another example, the process 800 can return to block 810 to produce additional stacked semiconductor assemblies on a second wafer after completing processing on a first wafer. Else the process 800 can proceed to block 816.

At block 816, the process 800 includes singulating the stacked semiconductor assemblies (e.g., as illustrated above with respect to FIGS. 6C and 6D). As discussed above, in various embodiments, the singulation can be any suitable process to separate stacked semiconductor assembl(ies) from surrounding materials, such as other stacked semiconductor assemblies, excess semiconductor substrates, and the like. In some embodiments, the process 800 can then return to block 810 to produce one or more additional modules (e.g., rather than after block 814).

Figure 9:
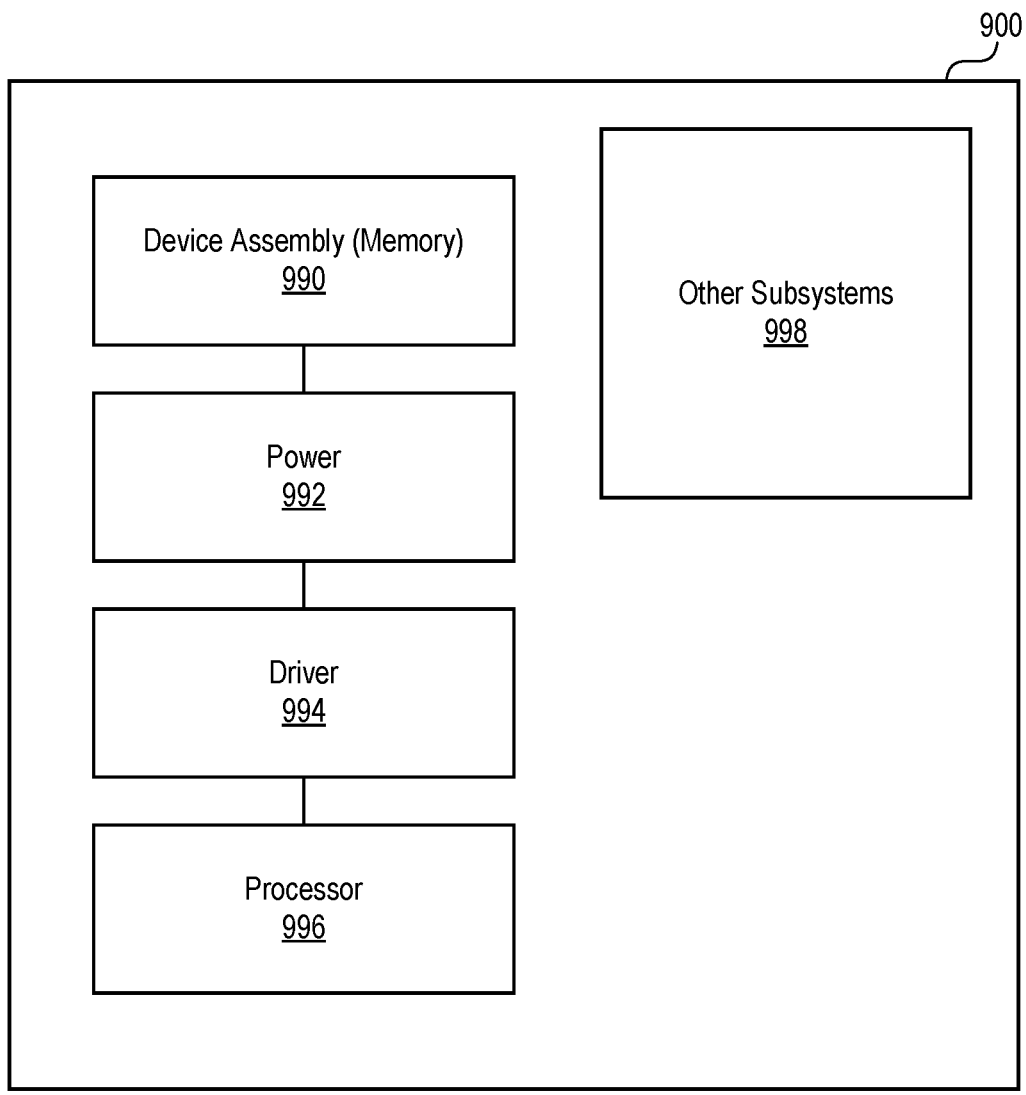
FIG. 9 is a schematic view of a system that includes a semiconductor die assembly configured in accordance with embodiments of the present technology.

FIG. 9 is a schematic view of a system that includes a semiconductor die assembly configured in accordance with embodiments of the present technology. Any one of the stacked semiconductor assemblies resulting from the methods described above with reference to FIGS. 1A-8 can be incorporated into any of a myriad of larger and/or more complex systems, a representative example of which is system 900 shown schematically in FIG. 9. The system 900 can include a memory 990 (e.g., SRAM, DRAM, flash, and/or other memory devices), a power supply 992, a drive 994, a processor 996, and/or other subsystems or components 998. Semiconductor devices having stacked semiconductor assemblies features like those described above with reference to FIGS. 2B, 7A, and 7B (or resulting from the processes described above with respect to FIGS. 3A-5C and 8), can be included in any of the elements shown in FIG. 9. For example, the processor 996 can include a stacked semiconductor device having a modular construction and hybrid bonds. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 900 include lights, cameras, vehicles, etc. With regard to these and other examples, the system 900 can be housed in a single unit or distributed over multiple interconnected units, e.g., through a communication network. The components of the system 900 can accordingly include local and/or remote memory storage devices and any of a wide variety of suitable computer-readable media.

CONCLUSION

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Further, the terms "approximately" and "about" are used herein to mean within at least within 10 percent of a given value or limit. Purely by way of example, an approximate ratio means within a ten percent of the given ratio.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments.

Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor die assembly, comprising:
   a lowermost semiconductor die having an upper surface and a first longitudinal footprint; and
   two or more modules carried by the upper surface of the lowermost semiconductor die including at least a first module stacked on the lowermost die and a second module stacked on the first module, each of the two or more modules including:
      a base semiconductor die having a second longitudinal footprint smaller than the first longitudinal footprint; and
      one or more upper semiconductor dies having a third longitudinal footprint smaller than the second longitudinal footprint,
      wherein the one or more upper semiconductor dies and the base semiconductor die are mechanically coupled via dielectric-dielectric bonds and electrically coupled via metal-metal bonds between adjacent ones of the one or more upper semiconductor dies and the base semiconductor die, and wherein the first module and the base semiconductor die in the second module are mechanically coupled via dielectric-dielectric bonds and electrically coupled via metal-metal bonds.

2. The semiconductor die assembly of claim 1 wherein each of the two or more modules further includes a first encapsulant contained within the second longitudinal footprint and insulating sidewalls of each of the one or more upper semiconductor dies, and wherein the semiconductor die assembly further comprises a second encapsulant contained within the first longitudinal footprint and insulating sidewalls of each of the two or more modules.

3. The semiconductor die assembly of claim 1 wherein the lowermost die and the first module are mechanically coupled via dielectric-dielectric bonds and electrically coupled via metal-metal bonds between the lowermost die and the first module.

4. The semiconductor die assembly of claim 3 wherein an uppermost module of the two or more modules further includes a top semiconductor die carried by the one or more upper semiconductor dies, and wherein the top semiconductor die has a thickness configured to match an overall height of the semiconductor die assembly to a predetermined height.

5. The semiconductor die assembly of claim 1 wherein:
the base semiconductor die includes an upper surface, a lower surface opposite the upper surface, a first bond pad at the upper surface, and a through substrate via extending between the first bond pad and the lower surface; and
the one or more upper semiconductor dies include a first semiconductor die carried by the base semiconductor die, wherein the first semiconductor die includes a lower surface and a second bond pad at the lower surface of the first semiconductor die, and wherein the second bond pad is electrically coupled to the first bond pad via a metal-metal bond.

6. The semiconductor die assembly of claim 5 wherein:
the through substrate via in the base semiconductor die is a first through substrate via and the metal-metal bond is a first metal-metal bond;
the first semiconductor die includes an upper surface, a third bond pad at the upper surface of the first semiconductor die, and a second through substrate via extending between the second and third bond pads; and
the one or more upper semiconductor dies further include a second semiconductor die carried by the first semiconductor die, wherein the second semiconductor die includes a lower surface and a fourth bond pad at the lower surface of the second semiconductor die, and wherein the fourth bond pad is electrically coupled to the third bond pad via a second metal-metal bond to establish an electrical connection between the second semiconductor die and the base semiconductor die.

7. The semiconductor die assembly of claim 1 wherein each of the one or more upper semiconductor dies and the base semiconductor die includes a plurality of electrical bond pads and a plurality of thermal bond pads.

8. A semiconductor device, comprising:
a lowermost die having a first longitudinal footprint and an upper surface;
a first sub-stack of two or more dies carried by the upper surface of the lowermost die, wherein the two or more dies in the first sub-stack include a base die with a second longitudinal footprint smaller than the first longitudinal footprint and an upper die carried by the base die with a third longitudinal footprint smaller than the second longitudinal footprint, and wherein each of the two or more dies in the first sub-stack are coupled by hybrid bonds; and a second sub-stack of two or more dies carried by the first sub-stack, wherein the two or more dies in the second sub-stack include a base die with the second longitudinal footprint and an upper die carried by the base die with the third longitudinal footprint, and wherein each of the two or more dies in the first sub-stack are coupled by hybrid bonds,
wherein the first sub-stack and the second sub-stack are coupled by hybrid bonds between the upper die in the first sub-stack and the base die in the second sub-stack.

9. The semiconductor device of claim 8 wherein:
the lowermost die includes an upper surface and a plurality of first bond pads on the upper surface; and
the base die in the first sub-stack has a lower surface and a plurality of second bond pads on the lower surface, wherein the plurality of second bond pads are individually electrically coupled to the plurality of first bond pads via a metal-metal bond.

10. The semiconductor device of claim 8 wherein:
The upper die in the first sub-stack includes an upper surface and a first bond pad on the upper surface; and
the base die in the second sub-stack has a lower surface and a second bond pad on the lower surface, wherein the hybrid bond between the upper die in the first sub-stack and the base die in the second sub-stack includes a metal-metal bond between the first bond pad and the second bond pad.

11. The semiconductor device of claim 8 wherein the lowermost die includes a first surface, a second surface opposite the first surface, at least one interconnect extending between the first surface to the second surface, and at least one bonding feature at the second surface and electrically coupled to the at least one interconnect.

12. The semiconductor device of claim 8, further comprising an uppermost die carried by the second sub-stack, wherein the uppermost die has a fourth longitudinal footprint smaller than the second longitudinal footprint.

13. The semiconductor device of claim 8 wherein the lowermost die includes a first surface carrying the first and second sub-stacks and a second surface opposite the first surface, wherein the second surface includes a redistribution layer electrically coupled to a plurality of interconnect structures.

14. The semiconductor device of claim 8 wherein:
the first sub-stack further includes a first encapsulant within the second longitudinal footprint and at least partially surrounding the upper die of the first sub-stack;
the second sub-stack further includes a second encapsulant within the second longitudinal footprint and at least partially surrounding the upper die of the second sub-stack; and
the semiconductor device further comprises a third encapsulant within the first longitudinal footprint and at least partially surrounding the first sub-stack and the second sub-stack.

15. A method of manufacturing a semiconductor die assembly, the method comprising:
constructing two or more modules of dies, wherein constructing each of the two or more modules includes:
stacking one or more upper dies on a base die in a position to form direct contact between bond pads on a first die of the one or more upper dies and the base die and direct contact between bond pads on interfacing upper dies, wherein the upper dies have a first longitudinal footprint, and wherein the base die is included in a first wafer of base dies;

forming a hybrid bond between each of the one or more upper dies and the base die;

applying a first encapsulant around each of the one or more upper dies; and singulating the base die from the first wafer, wherein the base die has a second longitudinal footprint larger than the first longitudinal footprint after singulation;

stacking each of the two or more modules on a lowermost die for the semiconductor die assembly in a position to form direct contact between bond pads on a lowermost module of the two or more modules and the lowermost die and direct contact between bond pads on interfacing modules, wherein the lowermost die is included in a second wafer of base dies;

forming a hybrid bond between each of the two or more modules and the lowermost die;

applying a second encapsulant around each of the one or more upper dies; and singulating the lowermost die from the second wafer, wherein the lowermost die has a third longitudinal footprint larger than the second longitudinal footprint after singulation.

16. The method of claim 15 wherein the first wafer includes a plurality of base dies, and wherein two or more modules are constructed concurrently on the first wafer.

17. The method of claim 15, further comprising thinning each of the two or more modules to polish the bond pads on each of the two or more modules before stacking the two or more modules on the lowermost die.

18. The method of claim 15, further comprising cleaning an upper surface and a lower surface of each of the two or more modules to reduce impurities before stacking the two or more modules on the lowermost die.

19. The method of claim 15 wherein forming the hybrid bond includes applying heat and/or pressure to form a metal-metal bond between the bond pads on each of the two or more upper dies and the base die.

20. The method of claim 15 wherein the constructing an uppermost module of the two or more modules further includes:

selecting a top die with a thickness to match an overall height of the semiconductor die assembly to a predetermined height; and stacking the top die on the one or more upper dies in a position to form direct contact between the bond pads on the one or more upper dies and bond pads on the top die before forming the hybrid bond.

* * * * *